(12) United States Patent
Bullard et al.

(10) Patent No.: US 8,557,397 B2
(45) Date of Patent: Oct. 15, 2013

(54) METALLURGICALLY BONDED STAINLESS STEEL

(71) Applicant: Arcanum Alloy Design Inc., Chicago, IL (US)

(72) Inventors: Daniel E. Bullard, Valparaiso, IN (US); Joseph E. McDermott, Chicago, IL (US)

(73) Assignee: Arcanum Alloy Design Inc., Sunnyvale, CA (US)

(*) Notice: Subject to any disclaimer, the term of this patent is extended or adjusted under 35 U.S.C. 154(b) by 0 days.

(21) Appl. No.: 13/629,699

(22) Filed: Sep. 28, 2012

(65) Prior Publication Data

US 2013/0171471 A1    Jul. 4, 2013

Related U.S. Application Data

(60) Provisional application No. 61/581,239, filed on Dec. 29, 2011, provisional application No. 61/581,241, filed on Dec. 29, 2011.

(51) Int. Cl.
*B32B 15/18* (2006.01)
*C23C 30/00* (2006.01)

(52) U.S. Cl.
USPC ............ 428/685; 428/941; 148/529; 148/537

(58) Field of Classification Search
None
See application file for complete search history.

(56) References Cited

U.S. PATENT DOCUMENTS

| 2,402,834 A | | 6/1946 | Nachtman | |
|---|---|---|---|---|
| 2,859,158 A | * | 11/1958 | Schaer | 205/180 |
| 3,165,823 A | | 1/1965 | Rowady | |
| 3,184,331 A | * | 5/1965 | Carter | 427/398.3 |

(Continued)

FOREIGN PATENT DOCUMENTS

| DE | 3201641 | * | 7/1983 |
|---|---|---|---|
| EP | 0204318 A | | 12/1986 |

(Continued)

OTHER PUBLICATIONS

Translation of JP 58-181860. Oct. 1983.*

(Continued)

*Primary Examiner* — John J Zimmerman
(74) *Attorney, Agent, or Firm* — Synthesis Intellectual Property LLC; Jonathan Goodman

(57) ABSTRACT

A steel form having a stainless steel exterior; the steel form includes a core region that comprises at least 55 wt. % iron which is metallurgically bonded to a stainless steel coating that consists of a stainless steel region and a bonding region. The stainless steel region can have a thickness of about 1 μm to about 250 μm, and a stainless steel composition that is approximately consistent across the thickness of the stainless steel region. The stainless steel composition includes an admixture of iron and about 10 wt. % to about 30 wt. % chromium. The bonding region is positioned between the stainless steel region and the core region, has a thickness that is greater than 1 μm and less than the thickness of the stainless steel region, and has a bonding composition. The bonding composition includes an admixture of iron and chromium, with a chromium concentration proximal to the stainless steel region that is approximately equal to the chromium concentration of the stainless steel region and has a chromium concentration proximal to the core region that has less than about 5 wt. % chromium.

34 Claims, 10 Drawing Sheets

(56) References Cited

U.S. PATENT DOCUMENTS

| | | | |
|---|---|---|---|
| 3,222,212 A | | 12/1965 | Samuel et al. |
| 3,294,498 A | | 12/1966 | Carter |
| 3,312,546 A | | 4/1967 | Mayer et al. |
| 3,403,988 A | | 10/1968 | Carter |
| 3,414,428 A | | 12/1968 | Kelly et al. |
| 3,615,902 A | | 10/1971 | Lesney |
| 3,642,517 A | * | 2/1972 | Faber .......................... 148/518 |
| 3,762,884 A | * | 10/1973 | Grisaffe et al. ............... 428/610 |
| 3,775,151 A | | 11/1973 | Baker et al. |
| 3,951,759 A | * | 4/1976 | Studer .......................... 205/148 |
| 3,998,603 A | * | 12/1976 | Rairden, III .................. 428/651 |
| 4,092,226 A | * | 5/1978 | Laing et al. ................... 205/104 |
| 4,119,701 A | * | 10/1978 | Fedor et al. ................ 423/213.2 |
| 5,015,535 A | * | 5/1991 | Marquez et al. .............. 428/610 |
| 6,139,649 A | * | 10/2000 | Wynns .......................... 148/277 |
| 2003/0178314 A1 | | 9/2003 | Polinski et al. |
| 2006/0257683 A1 | | 11/2006 | Polinski et al. |
| 2008/0076683 A1 | | 3/2008 | Okamoto et al. |
| 2008/0251389 A1 | | 10/2008 | Kingston |
| 2010/0243192 A1 | | 9/2010 | Balasubramanian et al. |
| 2011/0269051 A1 | | 11/2011 | Wijenberg et al. |
| 2012/0189868 A1 | | 7/2012 | Borovik et al. |

FOREIGN PATENT DOCUMENTS

| | | | |
|---|---|---|---|
| EP | 1844176 B1 | | 4/2011 |
| GB | 1035827 A | | 7/1966 |
| JP | 47-33244 | * | 8/1972 |
| JP | 57-143489 | * | 9/1982 |
| JP | 58-177459 | * | 10/1983 |
| JP | 58-181860 | * | 10/1983 |
| JP | 60-177176 | * | 9/1985 |
| JP | 60-230995 | * | 11/1985 |
| JP | 61-79758 | * | 4/1986 |
| JP | 62-297491 | * | 12/1987 |
| JP | 63-499 | * | 1/1988 |
| JP | 64-87761 | * | 3/1989 |
| JP | 1-195268 | * | 8/1989 |
| JP | 2-274866 | * | 11/1990 |
| JP | 3-197693 | * | 8/1991 |
| JP | 4-72091 | * | 3/1992 |
| JP | 7-310166 | * | 11/1995 |
| JP | 07-310166 | * | 11/1995 |
| JP | 7-310167 | * | 11/1995 |
| JP | 07-310167 | * | 11/1995 |
| JP | 10-226873 | * | 8/1998 |

OTHER PUBLICATIONS

Translation of JP 58-177459. Oct. 1983.*
Translation of JP 61-079758. Apr. 1986.*
Translation of JP 64-087761. Mar. 1989.*
Translation of JP 60-230995. Nov. 1985.*
A.R. Castle, D.R. Gabe; Chromium diffusion coatings; International Materials Review; 1999; 44(2); 37-59; ASM International, USA.
E.Zamani, G.H. Liaghat; Explosive welding of stainless steel-carbon steel coaxial pipes; J. Mater. Sci.; 2012; 47; 685-695.
G.H. Meier, C.Cheng, R.A. Perkings, W.Bakker; Diffusion Chromizing of Ferrous Alloys; Surface and Coating Technology; 1989; 39/40; 53-64.
K.Kawamura, T.Watanabe, K.Nishizaka; Determination of Surface Chromium Contents of Chromized Steel by Fluorescent X-ray Analysis; Transactions of the Japan Institute of Metals; 1969; 10; 267-270.
T.Yamashita; Microstructure of Austenitic Stainless Steel Explosively Bonded to Low Carbon-Steel; J. Electron Micro.; 1973; 22(1); 13-18.
Z.B. Wang, J.Lu, K.Lu; Chromizing behaviors of a low carbon steel processed by means of surface mechanical attrition treatment; Acta Materialia; 2005, 53, 2081-2089.
Written Opinion of the International Searching Authority, PCT/US2012/070469, Feb. 8, 2013.
Philippe, L.; Heiss, C.; Michler, J. "Electroplating of Stainless Steel", Chem. Mater., (2008) 20, 3377-3384.
G.A. Davies, A.B. Ponter, I.A. Menzies, "The Diffusion of Chromium in Iron and Low Carbon Steels", Acta Metallurgica, 1967, pp. 1799-1804, vol. 15.
K. Zhang, K. Zhang, H.X. Li, G.N. Chen, "Interface fracture behavior of electroplated coating on metal substrate under compresive strain", J. Materials Processing Tech., 2009, pp. 1337-1341, vol. 209.
R. Braun, M. Feller-Kniepmeier, "Diffusion of Chromium in alpha-Iron", Phys. Stat. Sol. (a), 1985, pp. 553-561, vol. 90/2.
R.G.I. Leferink, H. Barten, W.M.M. Huijbregts, "Chromium Diffusion Coatings on Low-Alloyed Steels for Corrosion Protection Linder Sulphidizing Conditions", VGB Kraftwerkstecknick, 1993, pp. 1-14, vol. 7313.
S.K. Gupta, S.R. Adolph, L.C. Tandon, L.L. Seigle, "Experimental and Theoretical Concentration Profiles at the Surface of Chromized Iron", Metallurgical Trans. (A), 1982, pp. 495-497, vol. 13A.
International Search Report and Written Opinion for International Application PCT/US2013/030902.
Czerwinksi, F. "Thermochemical Treatment of Metals", Heat Treatment—Conventional and Novel Applications, (2012) 73-112, InTech, CA.

* cited by examiner

METALLURGICALLY BONDED STAINLESS STEEL

CROSS-REFERENCE TO RELATED APPLICATIONS

This disclosure claims the benefit of priority to U.S. Provisional Patent Applications No. 61/581,239 filed 29 Dec. 2011, and No. 61/581,241 filed 29 Dec. 2011, the disclosures of which are incorporated herein in their entirety.

FIELD OF THE INVENTION

This disclosure is directed to a non-stainless steel product metallurgically bonded to and carrying a stainless steel outer layer.

BACKGROUND

Steel is one of the most ubiquitous structural materials in the world. Unfortunately, steel is prone to oxidation and thereby structural and decorative failure. Many techniques have been developed to attempt to provide a protective coating for steel; these include galvanizing, galvannealing, chromizing, cladding, painting and the like.

A good method for protecting steel is providing a stainless steel composition on the exterior of the steel product. Chromizing is a common method for the production of chromium-iron alloys, thereby stainless steels, on the surface of steels. Chromizing steel involves thermal deposition-diffusion processes whereby chromium is diffused into the steel and produces a varying concentration of chromium in the steel substrate. Typically, the surface of the substrate has the highest chromium concentration and as the distance into the substrate increases the chromium concentration falls off. Often the chromium concentration follows a typical diffusion function, that is, the chromium concentration decreases exponentially as a function of distance from the substrate. Other chromizing products, such as that described in U.S. Pat. No. 3,312,546, include diffusion coatings that have chromium concentrations above 20% that decrease linearly as a function of distance into the substrate (see FIG. 1). These high chromium-content coatings appear to include a foil or layer of chromium containing material carried by the bulk substrate.

The decreasing concentration of chromium as a function of depth into the substrate can affect the corrosion resistance of the material. That is, abrasion of the surface continuously produces new layers with lower chromium concentrations that are well understood to be less corrosion resistant than the initial surface. This undesirable effect, due to the variable concentration of chromium in the chromized surfaces, has been overcome by the advent of explosive cladding.

Explosive welding or cladding of stainless steel onto a carbon steel produces a stainless steel layer with a consistent composition metallurgically bonded to a carbon steel substrate. This technique overcomes the variable concentrations associated with chromizing but is severely limited by the thicknesses of the flying layer, the use of high explosives, and the metallurgical bond that is formed. Two types of metallurgical bonds have been observed in explosively welding metals: under high explosive loading the cross-section to be composed of a wave-like intermixing of the base and flying layers and under lower explosive loadings the cross-section includes an implantation of grains of the flying layer into the base layer. E.g. see: Explosive welding of stainless steel—carbon steel coaxial pipes, *J. Mat. Sci.*, 2012, 47-2, 685-695; and Microstructure of Austenitic stainless Steel Explosively Bonded to low Carbon-Steel, *J. Electron Microsc.* (Tokyo), 1973, 22-1, 13-18.

The prior art fails to teach a material that includes a stainless steel layer with a consistent composition diffusion bonded to a carbon steel substrate. Ideally, such a material would include the corrosion resistance associated with the explosively welded stainless steel and the deep diffusion bonding observed typical of chromizing applications.

SUMMARY

A first embodiment is a metallurgically bonded stainless steel on a steel form that includes a core region that comprises at least 55 wt. % iron and carries a stainless steel coating. The stainless steel coating consists of a stainless steel region and a bonding region. The stainless steel region having a thickness of about 1 µm to about 250 µm, and having a stainless steel composition that is approximately consistent across the thickness of the stainless steel region. The stainless steel composition includes an admixture of iron and chromium, and includes a chromium concentration of about 10 wt. % to about 30 wt. %. The bonding region is positioned between the stainless steel region and the core region, has a thickness that is greater than 1 µm and less than the thickness of the stainless steel region, and has a bonding composition. The bonding composition includes an admixture of iron and chromium, and the bonding composition has a chromium concentration proximal to the stainless steel region that is approximately equal to the chromium concentration of the stainless steel region and has a chromium concentration proximal to the core region that has less than about 5 wt. % chromium.

A second embodiment is a steel sheet that includes a first stainless steel region having a thickness of about 1 µm to about 250 µm; a first bonding region positioned between the first stainless steel region and a core region, the first bonding region having a thickness that is greater than 1 µm and less than the thickness of the first stainless steel region; the core region having a thickness of about 100 µm to about 4 mm, the core region having a core composition that comprises at least 85 wt. % iron; a second bonding region positioned between the core region and a second stainless steel region; and the second stainless steel region having a thickness of about 1 µm to about 250 µm. The second bonding region has a thickness that is greater than 1 µm and less than the thickness of the second stainless steel region. The first and second stainless steel regions have stainless steel compositions that are approximately consistent across the thickness of the respective stainless steel regions. Individually, the stainless steel compositions include an admixture of iron and chromium, and a chromium concentration of about 10 wt. % to about 30 wt. %. The first and second bonding regions have bonding compositions that, individually, comprise an admixture of iron and chromium, having a chromium concentration proximal to the stainless steel region that is approximately equal to the chromium concentration of the stainless steel region and having a chromium concentration proximal to the core region that has less than about 5 wt. % chromium.

BRIEF DESCRIPTION OF THE FIGURES

For a more complete understanding of the disclosure, reference should be made to the following detailed description and accompanying drawing figures wherein.

Figure 1:
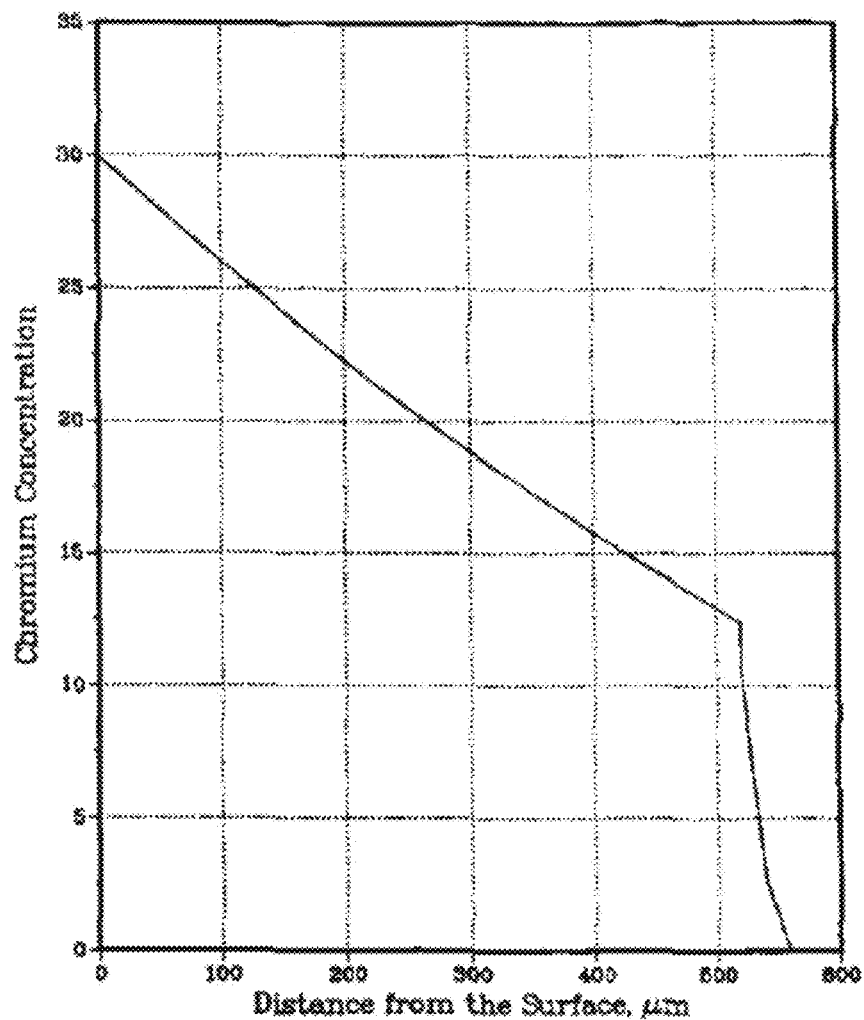
FIG. 1 is a plot of chromium concentration as a function of depth for chromized steel (prior art)

While specific embodiments are illustrated in the figures, with the understanding that the disclosure is intended to be illustrative, these embodiments are not intended to limit the invention described and illustrated herein.

DETAILED DESCRIPTION

The term "admixture" as related to a plurality of metals, preferably transition metals, means the metals are intermixed in a given region. An admixture can be further described as a solid solution, an alloy, a homogeneous admixture, a heterogeneous admixture, a metallic phase, or one of the preceding further including an intermetallic or insoluble structure, crystal, or crystallite. Importantly, the term "admixture" as used herein expressly excludes intermixed grains or crystals or inter-soluble materials. That is, the herein described admixtures do not include distinguishable grains of compositions that can form a solid solution, a single metallic phase or the like, for example by heating the admixture to a temperature where the grains of compositions could inter-diffuse. Notably, an admixture can include intermetallic species as these intermetallic species are not soluble in the "solute" or bulk metallic phase. Furthermore, this exclusion of intermixed-intersoluble materials does not limit the homogeneity of the sample; a heterogeneous admixture can include a concentration gradient of at least one of the metals in the admixture but does not include distinguishable grains or crystals of one phase or composition intermixed with grains, with crystals, or in a solute having a second phase of composition in which the first phase of composition is soluble.

The noun "alloy", as related to an admixture of metals, means a specific composition of metals, preferably transition metals, with a narrow variation in concentration of the metals throughout the admixture. One example of an alloy is 304 stainless steel that has an iron composition that includes about 18-20 wt. % Cr, about 8-10.5 wt. % Ni, and about 2 wt. % Mn. As used herein, an alloy that occupies a specific volume does not include a concentration gradient. Such a specific volume that includes a concentration gradient would include, as an admixture, a plurality or range of alloys.

Herein, the term "concentration gradient" refers to the regular increase or decrease in the concentration of at least one element in an admixture. Typically, a concentration gradient is observed in an admixture where at least one element in the admixture increases or decreases from a set value to a higher/lower set value. The increase or decrease can be linear, parabolic, Gaussian, or mixtures thereof. Typically, a concentration gradient is not a step function. A step function variation is better described as a plurality of abutting admixtures.

Layers and/or regions of the herein described materials are referred to as being "metallurgically bonded." That is, the metals, alloys or admixtures that provide the composition of the layers and/or regions are joined through a conformance of lattice structures. No intermediate layers such as adhesives or braze metal are involved. Bonding regions are the areas in which the metallurgical bonds between two or more metals, alloys or admixtures display a conformance of lattice structures. The conformance of lattice structures being the gradual change from the lattice of one metal, alloy or admixture to the lattice of the metallurgically bonded metal, alloy or admixture.

While terms used herein are typical for the steel industry, the herein disclosed compositions or regions may consist of, or consist essentially of, one or more elements. Notably, steel is considered to be carbon steel, that is a mixture of at least iron and carbon, and generally contains up to 2% total alloying elements; including carbon, chromium, cobalt, niobium, molybdenum, nickel, titanium, tungsten, vanadium, zirconium or other metals. Thereby, steel or carbon steel does not consist of, or consist essentially of, one or more elements but can be random composition of a variety of elements supported in iron. When compositions or regions are described as consisting of, or consisting essentially of, one or more elements, the concentration of non-disclosed elements in the composition or region are not detectable by energy-dispersive X-ray spectroscopy (EDX) (e.g., EDX has a typical sensitivity down to levels of about 0.5 to 1 atomic percent). When the composition or region is described as consisting of one or more elements, the concentration of the non-disclosed elements in the composition or region is not detectable or within the measurable error of direct elemental analysis, e.g., by ICP.

The herein described material includes a variety of metallurgically bonded metals, alloys or admixtures. The composition or concentration of transition metals in the metals, alloys or admixtures is an important feature of the herein described materials. Equally important is the variation of the compositions or concentrations as a function of depth or distance through the material. Accordingly, herein, the composition or concentrations of the component metals in the described metals, alloys or admixtures is determined by EDX. Furthermore, herein, when a composition is termed "approximately consistent" over a distance, in a layer, or in a region, the term means that the relative percentage of metals in that distance, layer or region is consistent within the standard error of measurement by EDX. Preferably, the moving average over the "approximately consistent" distance, layer or region has a slope of about zero when plotted as a function of concentration (y-axis) to distance (x-axis). More preferably, the concentration (or relative percentage) of the individual elements in the composition vary by less than about 5 wt. %, 4 wt. %, 3 wt. %, 2 wt. %, or 1 wt. % over the distance.

A first embodiment is a steel form having a stainless steel exterior. The steel form includes a core region which carries a stainless steel coating; that is, the steel form includes the core region, a bonding region, and a stainless steel region, where the bonding region metallurgically bonds the core region to the stainless steel region. Herein, the steel form is defined by layers or regions that include at least 55 wt. % iron, notably, the steel form can be coated by, for example, organic or inorganic coatings but these coatings are not, herein, part of the steel form. The core region of the steel form includes iron, preferably includes at least 55 wt. % iron. More preferably, the iron concentration in the core region is greater than 98 wt. %, 99 wt. %, or 99.5 wt. %. Even more preferably, the core region is a carbon steel having a carbon concentration of less than about 0.5 wt. %. Still more preferably, the core region is a carbon steel having a carbon concentration of less than about 0.25 wt. %. Even still more preferably, the core region is substantially free of chromium and/or substantially free of nickel.

The stainless steel coating carried by the core region consists of a stainless steel region and a bonding region; the bonding region proximal to the core region and the stainless steel region including the stainless steel exterior. The stainless steel region, preferably, has a thickness of about 1 μm to about 250 μm, about 5 μm to about 250 μm, about 10 μm to about 250 μm, about 25 μm to about 250 μm, about 50 μm to about 250 μm, about 10 μm to about 200 μm, or about 10 μm to about 100 μm.

The stainless steel region has a stainless steel composition. Herein, a stainless steel composition means that the stainless steel region includes an admixture of iron and chromium, specifically, the stainless steel composition includes a chromium concentration of about 10 wt. % to about 30 wt. %, for example the chromium concentration can be about 10 wt. %, about 12 wt. %, about 14 wt. %, about 16 wt. %, about 18 wt. %, about 20 wt. %, about 22 wt. %, about 24 wt. %, about 26 wt. %, about 28 wt. %, or about 30 wt. %. Preferably, the stainless steel composition is approximately consistent across the thickness of the stainless steel region.

The stainless steel composition includes an admixture of iron and chromium, and can further include a transition metal selected from the group consisting of nickel, molybdenum, titanium, niobium, tantalum, vanadium, tungsten, copper, and a mixture thereof. In one example, the stainless steel composition comprises an admixture of iron, chromium, and nickel, and comprises a nickel concentration of about 5 wt. % to about 20 wt. %. In this example, the bonding composition (as described below) consists essentially of iron, chromium and nickel.

In one preferable example, the stainless steel composition has a chromium concentration of about 16 wt. % to about 25 wt. %, and nickel concentration of about 6 wt. % to about 14 wt. %. In another preferable example, the stainless steel composition consists essentially of iron, chromium and nickel.

In one aspect, the stainless steel composition can have a Cr/Ni mass ratio of about 70/30 (or about 70 wt. % Cr and about 30 wt. % Ni), or about 69/31, or about 69.2/30.8. In other aspect, the Cr/Ni mass ratio can be in a range of about 90/10 to about 50/50, or about 80/20 to about 60/40, or about 75/25 to about 65/35. In aspects where the deposited Cr and Ni layer(s) on an iron substrate is/are substantially free of iron, the substrate and the deposited layer(s) can be heated to and/or held at an annealing temperature until the Cr/Ni mass ratio of the stainless steel surface composition is about 35/15.5, about 30/13, about 25/11, about 20/8.9 or about 18/8 (represented as the wt. % of the elements in the composition, balance Fe).

In another example, the stainless steel composition can have a chromium concentration of about 10.5 wt. % to about 18 wt. %. In still another preferable example, the stainless steel composition consists essentially of iron and chromium; and the bonding composition consists essentially of iron and chromium.

As stated previously, the stainless steel coating includes the stainless steel region and the bonding region which is positioned between the stainless steel region and the core region. The bonding region, preferably, has a thickness that is greater than 1 μm and less than the thickness of the stainless steel region. More preferably, the bonding region has a thickness of about 5 μm to about 200 μm, about 5 μm to about 100 μm, or about 10 μm to about 50 μm.

The bonding region has a bonding composition, which includes an admixture of iron and chromium. The bonding composition further includes a chromium concentration proximal to the stainless steel region that is approximately equal to the chromium concentration of the stainless steel region and having a chromium concentration proximal to the core region that has less than about 5 wt. %, about 4 wt. %, about 3 wt. %, about 2 wt. %, about 1 wt. %, or about 0.5 wt. % chromium. That is, the chromium concentration falls through the boding region to a concentration that is less than half of the concentration in the stainless steel region, preferably falls to a concentration that is approximately equal to the concentration of chromium in the core region. The chromium concentration gradient in the bonding region can include a linear decrease in chromium concentration or a sigmoidal decrease in chromium concentration, preferably the sigmoidal decrease.

Figure 10:
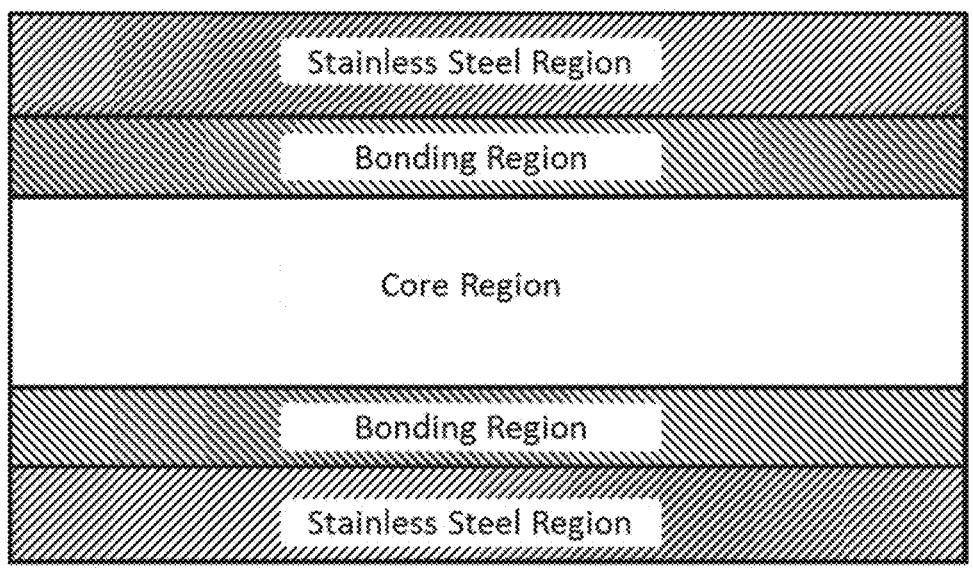
FIG. 10 is a schematic of one embodiment described herein.

Another embodiment is a steel sheet that includes a plurality of regions, including a first stainless steel region, a first bonding region positioned between the first stainless steel region and a core region, the core region, a second bonding region positioned between the core region and a second stainless steel region, and the second stainless steel region (e.g., see FIG. 10). In this embodiment, the first stainless steel region has a thickness of about 1 μm to about 250 μm; the first bonding region has a thickness that is greater than 1 μm and less than the thickness of the first stainless steel region; the core region having a thickness of about 100 μm to about 4 mm; the second stainless steel region having a thickness of about 1 μm to about 250 μm; and the second bonding region having a thickness that is greater than 1 μm and less than the thickness of the second stainless steel region.

Preferably, the core region has a core composition that comprises at least 85 wt. % iron. More preferably, the iron concentration in the core region is greater than 98 wt. %, 99 wt. %, or 99.5 wt. %. Even more preferably, the core region is a carbon steel having a carbon concentration of less than about 0.5 wt. %. Still more preferably, the core region is a carbon steel having a carbon concentration of less than about 0.25 wt. %. Even still more preferably, the core region is substantially free of chromium.

The first and second stainless steel regions have stainless steel compositions that are approximately consistent across the thickness of the respective stainless steel regions. These stainless steel compositions, individually, include an admixture of iron and chromium with a chromium concentration of about 10 wt. % to about 30 wt. %, for example the chromium concentration can be about 10 wt. %, about 12 wt. %, about 14 wt. %, about 16 wt. %, about 18 wt. %, about 20 wt. %, about 22 wt. %, about 24 wt. %, about 26 wt. %, about 28 wt. %, or about 30 wt. %.

The first and second bonding regions having bonding compositions that include an admixture of iron and chromium. Individually, the bonding regions have chromium concentrations proximal to the respective stainless steel regions that are approximately equal to the chromium concentration of the stainless steel region and have chromium concentrations proximal to the core region that has less than about 5 wt. %, about 4 wt. %, about 3 wt. %, about 2 wt. %, about 1 wt. %, or about 0.5 wt. % chromium, preferably the chromium concentrations proximal to the core region are approximately equal to the chromium concentration in the core region. That is, the individual bonding regions each have a chromium concentration gradient. The chromium concentration gradient in the bonding region can include a linear decrease in chromium concentration or a sigmoidal decrease in chromium concentration, preferably a sigmoidal decrease.

In one example, the first and second stainless steel composition, individually, comprises an admixture of iron, chromium, and nickel, with a nickel concentration of about 5 wt. % to about 20 wt. %. In this example the respective first and second bonding compositions also include nickel. The Cr/Ni mass ratio can be about 70/30 (or about 70 wt. % Cr and about 30 wt. % Ni), or about 69/31, or about 69.2/30.8. In other aspect, the Cr/Ni mass ratio can be in a range of about 90/10 to about 50/50, or about 80/20 to about 60/40, or about 75/25 to about 65/35. In still another aspect, the Cr/Ni mass ratio of the stainless steel composition can be about 35/15.5, about 30/13, about 25/11, about 20/8.9 or about 18/8 (represented as the wt. % of the elements in the composition, balance Fe).

In another example, the first and second stainless steel composition, individually, comprises an admixture of iron, chromium, and a transition metal selected from the group consisting of nickel, molybdenum, titanium, niobium, tantalum, vanadium, tungsten, copper, and a mixture thereof. In this example, the respective bonding compositions would also include the selected transition metal(s).

Preferably, the steel sheet that includes the above described regions has a thickness of about 0.1 mm to about 4 mm. The thickness is the lesser of the height, length, or width of the material. For a typical sheet, the length and width are multiple orders of magnitude greater than the height (or thickness). For example the steel sheet can be a steel coil with a width of about 1 meter to about 4 meters and a length of greater than 50 meters.

The individual stainless steel regions can have the same or different thicknesses; preferably the first and second stainless steel regions have approximately the same thickness (e.g., ±5%). In one example, the first stainless steel region has a thickness of about 10 µm to about 100 µm. In another example the second stainless steel region has a thickness of about 10 µm to about 100 µm. The individual bonding regions can have the same or different thicknesses; preferably the first and second bonding regions have approximately the same thickness (e.g., ±5%). In another example, the first bonding region has a thickness of about 5 µm to about 100 µm. In still another example, the second bonding region has a thickness about 5 µm to about 100 µm.

Still another embodiment is a steel form that includes a brushed stainless steel surface carried by a stainless steel region. In this embodiment, the stainless steel region can have a thickness of about 5 µm to about 200 µm, has an approximately consistent stainless steel composition that includes an admixture of iron and chromium, and can have a chromium concentration of about 10 wt. % to about 30 wt. %. The stainless steel region is carried by a bonding region. Preferably, the bonding region has a thickness of about 5 µm to about 200 µm but less than the thickness of the stainless steel region. The bonding region metallurgically bonds the stainless steel region to a core region. The core region has a core composition that includes at least 85 wt. % iron. The bonding region further includes a bonding composition which includes an admixture of iron and chromium, and a bonding region concentration gradient that decreases from a chromium concentration proximal to the stainless steel region that is approximately equal to the chromium concentration of the stainless steel region to a chromium concentration proximal to the core region that is less than about 1 wt. %.

In addition to the description of the embodiments provided above, the herein described products are preferably free of plastic deformation. Plastic deformation is the elongation or stretching of the grains in a metal or admixture brought about by the distortion of the metal or admixture. For example, cold rolled steel with display plastic deformation in the direction of the rolling. Plastic deformation in steel is easily observable and quantifiable through the investigation of a cross-section of the steel. Herein, the products are preferably substantially free of plastic deformation; that is the products include less than 15%, 10%, or 5% plastic deformation. More preferably, the products described herein are essentially free of plastic deformation; that is, the products include less than 1% plastic deformation. Even more preferably, the products described herein are free of plastic deformation; that is, plastic deformation in the described products is not observable by investigation of a cross section of the product.

The herein described products which include a stainless steel layer or region carried by a steel or carbon steel substrate or core can be manufactured by the low temperature deposition of chromium onto a starting substrate that becomes the core region. The process of forming a metal article that has a stainless steel layer on at least one surface of the article, generally, includes selecting an desired stainless steel composition, selecting a substrate that is preferably macroscopically chemically homogeneous, depositing onto the substrate at least one deposition layer, and forming the stainless steel layer and the bonding layer by diffusing all or some of the deposited layer into the substrate. Notably, a first feature of this embodiment is determining a stainless steel layer composition, a core composition, and a bonding layer concentration gradient.

This embodiment further includes providing a first surface upon which the low temperature deposition will occur. Preferably, the first surface and the deposition substrate have substantially similar compositions and are comprised of the majority element or the majority elements of the bulk composition. The deposition substrate (e.g., iron, aluminum, titanium, copper, and alloys thereof) should be clean of organic layers and/or oxide layer. Cleaning can be accomplished by heating the first surface to a reducing temperature in a reducing atmosphere for example a reducing atmosphere that consists essentially of $H_2$, $HN_x$, or $CO/CO_2$, preferably $H_2$. The reducing temperature can be any temperature that provides a sufficient reaction rate between the reducing atmosphere and the layers on the first surface. Preferably, the reducing temperature is at least 100° C. below the melting temperature of the first surface. The reducing temperature can be in a range of about 200° C. to about 1000° C., about 300° C. to about 900° C., or about 500° C. to about 800° C.

Available techniques for the deposition of chromium onto the starting substrate include, but are not limited to, physical vapor deposition, chemical vapor deposition, metal-organic chemical vapor deposition, sputtering, ion implantation, electroplating, electroless plating, pack cementation, the ONERA process, salt bath processes, chromium-cryolite processes, Alphatising process, or the like.

In one example, the process is a vapor deposition of metals onto the first surface of the deposition substrate. This process can include heating the first surface to a deposition temperature; for example, the deposition temperature can be at least 400° C. Onto this heated first surface is deposited a first deposition layer that includes at least one of the minority elements of the stainless steel layer composition (e.g., chromium). The deposition temperature is preferably at least 200° C., at least 300° C., at least 400° C., or at least 500° C. In a specific example, the first surface can be heated to a deposition temperature in a range of about 300° C. to about 1000° C., about 400° C. to about 900° C., or about 500° C. to about 800° C. A first deposition gas composition is then provided to the heated first surface at a gas composition temperature in a range of about 50° C. to about 750° C., about 75° C. to about 550° C., or about 100° C. to about 450° C.

Depositing the deposition layer includes contacting the first surface with a first deposition gas at a deposition temperature. The deposition gas can have a composition that includes a carrier gas and one or more volatile, deposition layer precursors, can consist of one or more volatile deposition layer precursors, or can consist of one or more volatile, deposition layer precursors and $H_2$. Preferably, deposition gaseous composition includes $H_2$.

Figure 2:
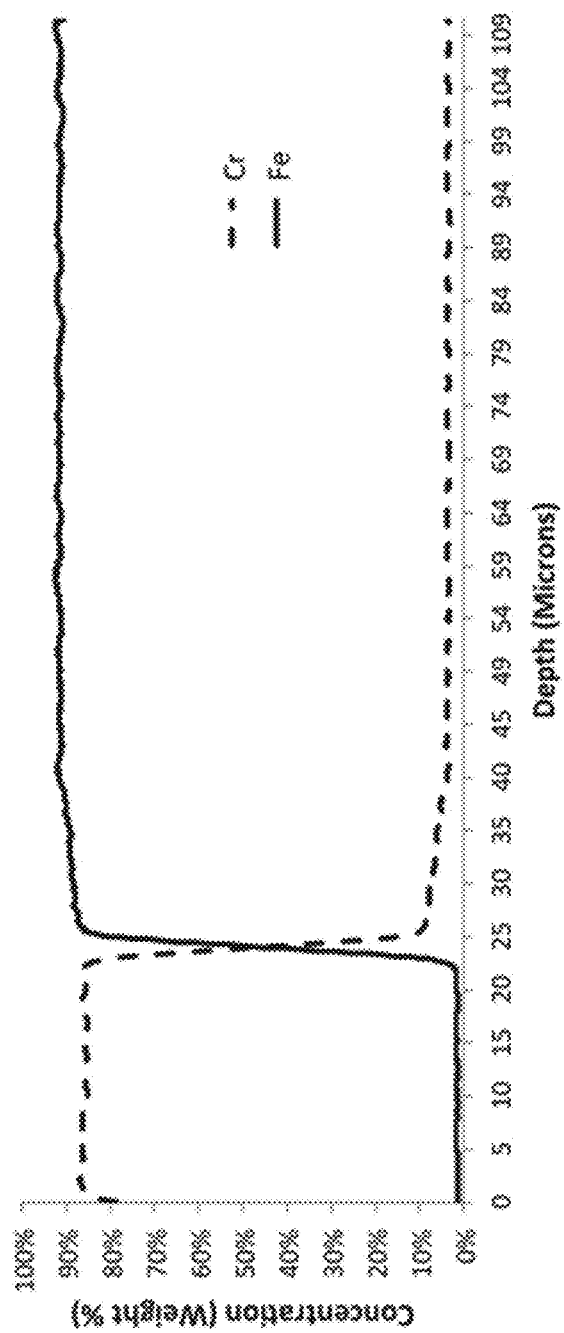
FIG. 2 is a plot of chromium and iron concentrations as a function of depth for a precursor to a 300 series product.
Figure 3:
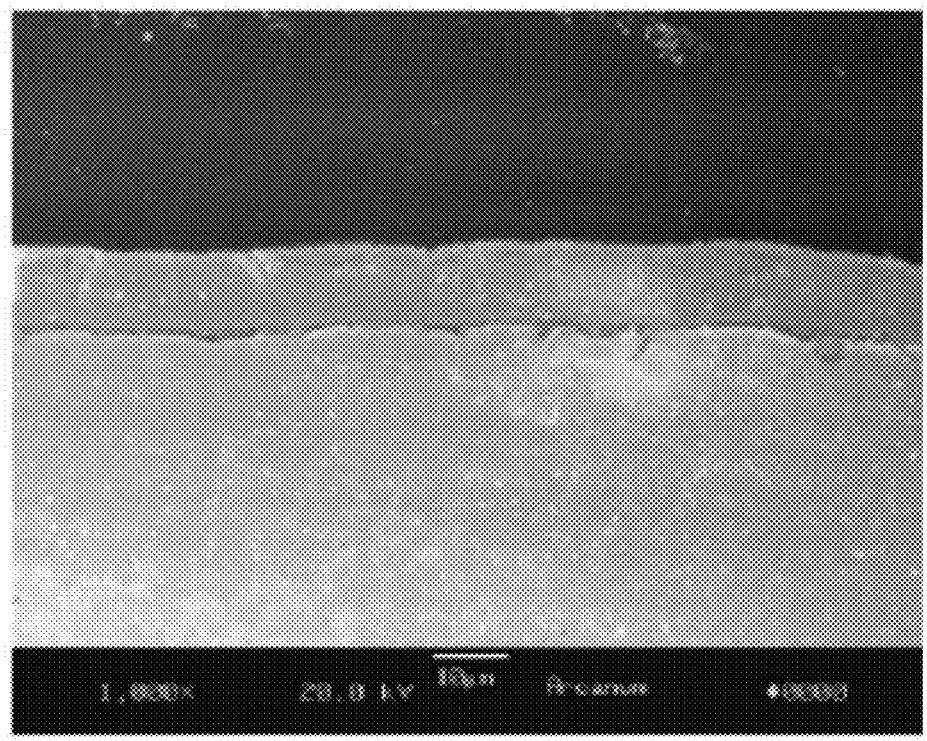
FIG. 3 is a cross section SEM image of the precursor to the 300 series product.
Figure 6:
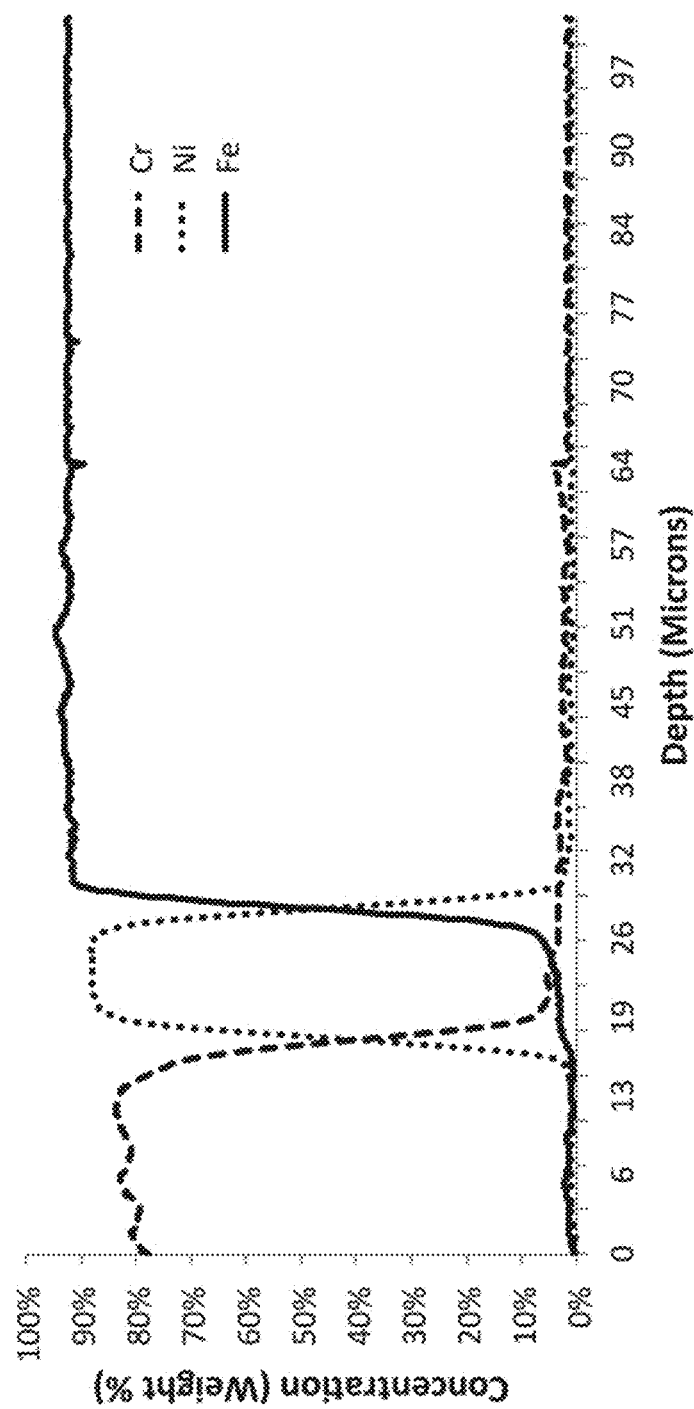
FIG. 6 is a plot of chromium, nickel, and iron concentrations as a function of depth for a precursor to a 400 series product.
Figure 7:
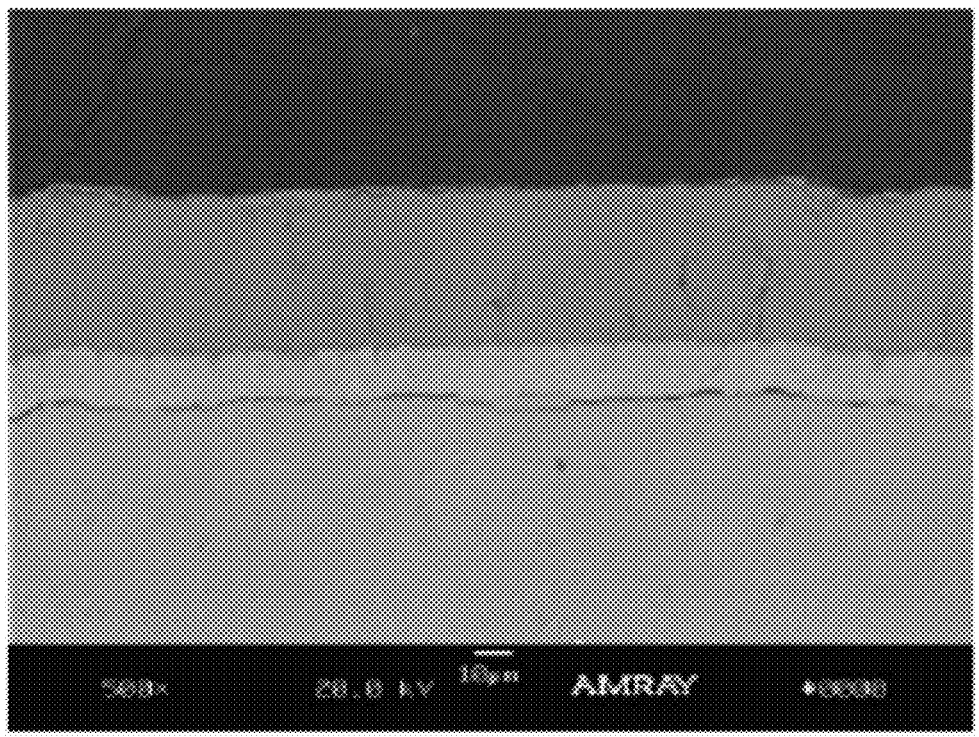
FIG. 7 is a cross section SEM image of the precursor to the 400 series product.

In one preferable example, the chromium is deposited in a non-compact layer upon the starting substrate. In another preferable example, the chromium is deposited as a layer that consists essentially of chromium. FIGS. 2 and 3 show EDX and scanning electron microscopy (SEM) data of the as-deposited chromium layer on the carbon steel substrate. FIG. 2 shows the approximate weight percentages of the as-deposited chromium and iron in the carbon steel substrate. FIG. 3 shows an SEM image of the cross section of the chromium deposited on the carbon steel substrate. In still another preferable example, the chromium is deposited as an admixture of iron and chromium. In yet another preferable example, the chromium is deposited as an admixture of chromium and an element selected from the group consisting of nickel, molybdenum, titanium, niobium, tantalum, vanadium, tungsten, copper, and a mixture thereof. In still yet another preferable example, a plurality of layers of chromium and an element selected from the group consisting of nickel, molybdenum, titanium, niobium, tantalum, vanadium, tungsten, copper, and a mixture thereof are deposited onto the starting substrate. Volatile, deposition layer precursor(s) can be, individually, selected from metal alkyls, metal alkylamides, metal amines, metal cyclopentadienyls, metal acetylacetonates, metal carbonyls, metal hydrides, and mixtures thereof. Examples of volatile, deposition layer precursors can be found in *The Chemistry of Metal CVD*, T. T. Kodas and M. J. Hampden-Smith, 2008 John-Wiley and Sons and the *Handbook of Chemical Vapour Deposition (CVD), Principles, Technology, and Applications,* 2nd Edition, Hugh O. Pierson, 1999, Noyes Publications, each incorporated herein by reference in their entirety. Preferably, the volatile, deposition layer precursor is selected from metal carbonyls, metal hydrides, and combinations thereof. Examples include but are not limited to $Cr(CO)_6$, $Mn_2(CO)_{10}$, $Fe(CO)_5$, $Co_2(CO)_8$, $Ni(CO)_4$, $Mo(CO)_6$, $HCo(CO)_4$, and $HMn(CO)_5$. More preferably, the volatile deposition layer precursor is a metal carbonyl. FIGS. 6 and 7 show EDX and SEM data of as-deposited nickel and chromium layers on the carbon steel substrate. FIG. 6 shows the approximate weight percentages of the as-deposited chromium, as-deposited nickel, and iron in the carbon steel substrate. FIG. 7 shows an SEM image of the cross section of the chromium and nickel carried by the carbon steel substrate.

Deposition from a deposition gas can provide a single deposited element or a plurality of deposited elements. In one example, the deposition gas provides a single deposited element from a single volatile deposition layer precursor (e.g., chromium from $Cr(CO)_6$). In another example, the deposition gas includes a second volatile deposition layer precursor and, preferably, provides two deposited elements as the deposition layer (e.g., chromium and nickel from $Cr(CO)_6$ and $Ni(CO)_4$). In yet another example the deposition gas includes a plurality of volatile, deposition layer precursors and, preferably, provides a plurality of deposited elements as the deposition layer.

Following the deposition of a sufficient quantity of elements onto the substrate, the deposition of the first deposition layer is then discontinued and then the first surface is held at a processing temperature (e.g., at least 400° C.) for a processing time. Holding the first surface at the processing temperature for the processing time provides for the diffusion of the minority elements (e.g., chromium) into the bulk composition and the formation of the stainless steel layer and the bonding layer's alloy concentration gradient.

Figure 4:
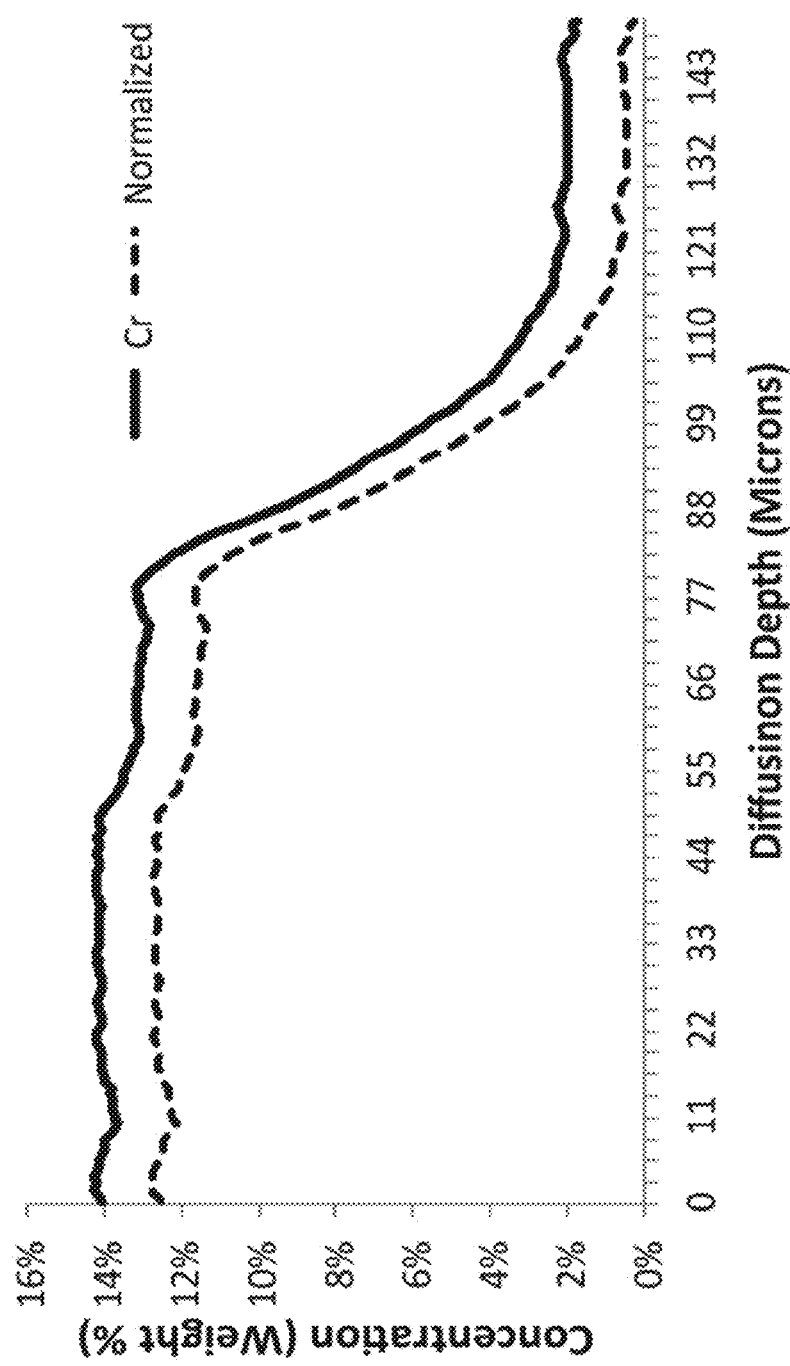
FIG. 4 is a plot of chromium concentrations as a function of depth for a 300 series product, (solid line) the energy-dispersive X-ray spectroscopy (EDX) data as measured, (dashed line) the EDX data normalized for the concentration of chromium in the core.
Figure 5:
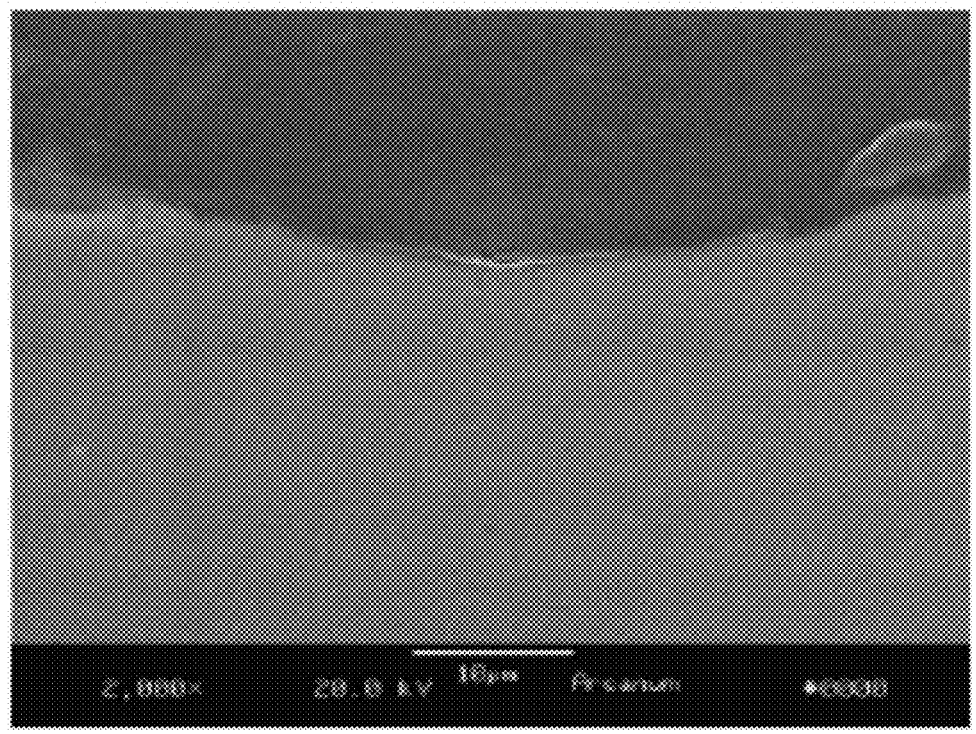
FIG. 5 is a cross section SEM image of the 300 series product.

In one example and following the deposition of the chromium onto the starting substrate, the deposited chromium and any other deposited metals are heated to a temperature in a range of about 800° C. to about 1200° C., or about 1000° C. Heating at or above the annealing temperature (e.g., about 1000° C.) can include holding the substrate and deposition layer at that temperature for an annealing time that is sufficiently long to yield a homogeneous stainless steel layer (e.g., greater than 10 h, 20 h, 30 h, or 40 h). FIGS. 4 and 5 show EDX and SEM data of a 400 series stainless steel carried by a carbon steel core that was made by heating the deposited chromium, e.g., as shown in FIGS. 2 and 3. FIG. 4 shows the approximate weight percentage of chromium (as measured and normalized) as a function of depth. The stainless steel region is comparable to a stainless steel composition designation selected from the group consisting of 403 SS, 405 SS, 409 SS, 410 SS, 414 SS, 416 SS, 420 SS, and 422 SS. The designation of the composition of the stainless steel layer can be affected by the concentration of trace elements in the carbon steel substrate (e.g., nickel, carbon, manganese, silicon, phosphorus, sulfur, and nitrogen), by the addition of one or more trace elements to the as deposited chromium, or by the addition of one or more trace elements by post treatment of the as-deposited chromium (e.g., by solution, deposition, or ion implantation methods). FIG. 5 shows an SEM cross section of the stainless steel region, bonding region and core regions notably omitting any observable distinction (e.g., interface) between the respective regions.

Figure 8:
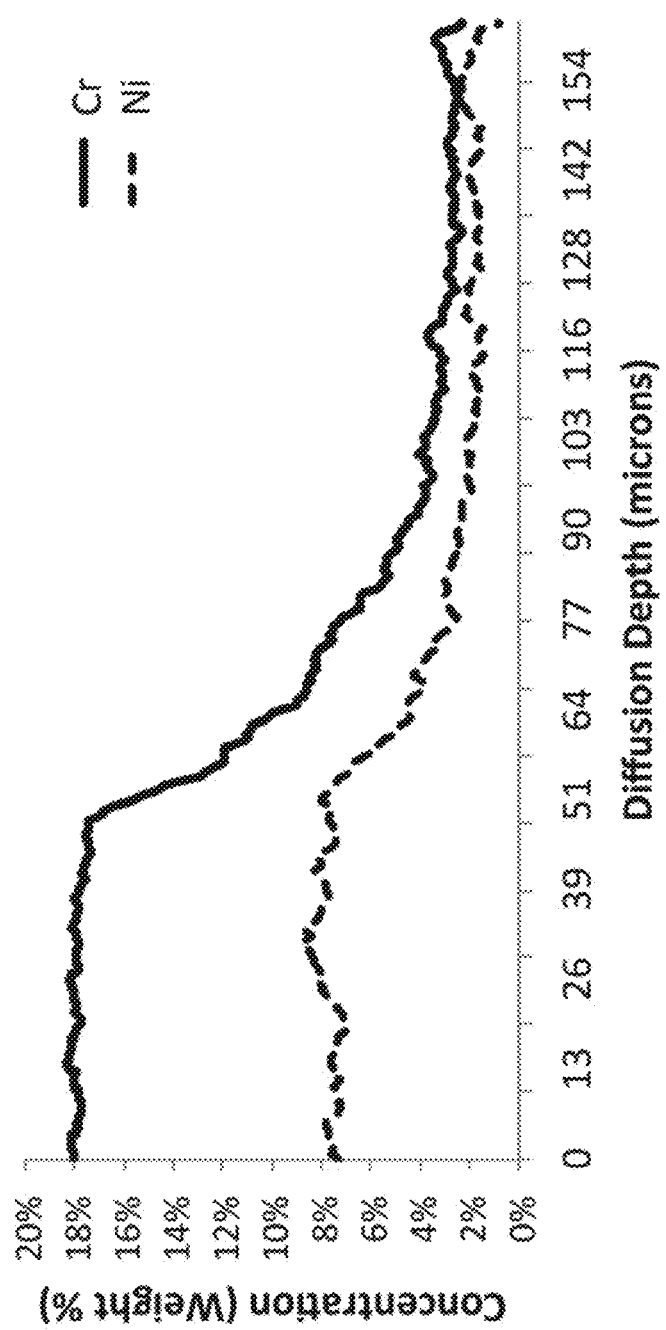
FIG. 8 is a plot of chromium and nickel concentrations as a function of depth for a 400 series product.
Figure 9:
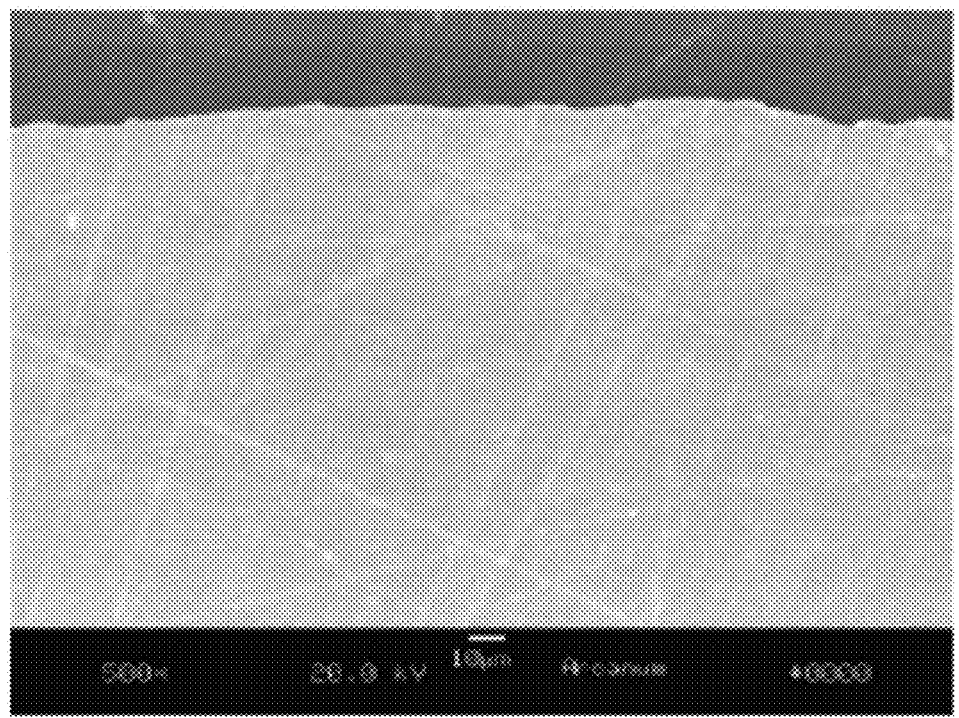
FIG. 9 is a cross section SEM image of the 400 series product.

FIGS. 8 and 9 show EDX and SEM data of a 300 series stainless steel carried by a carbon steel core that was made by heating the deposited chromium, e.g., as shown in FIGS. 6 and 7. FIG. 8 shows the approximate weight percentages of chromium and nickel as a function of depth. The stainless steel region is comparable to a stainless steel composition designation selected from the group consisting of 301 SS, 302 SS, 303 SS, and 304 SS. Other The designation of the composition of the stainless steel layer can be affected by the concentration of trace elements in the carbon steel substrate (e.g., carbon, manganese, silicon, phosphorus, sulfur, and nitrogen), by the addition of one or more trace elements to the as deposited chromium, or by the addition of one or more trace elements by post treatment of the as-deposited chromium (e.g., by solution, deposition, or ion implantation methods). Furthermore, the designation of the composition of the stainless steel is affected by the concentrations of the chromium and nickel in the stainless steel layer; these concentrations can be increased or decreased independently. FIG. 9 shows a SEM cross section of the stainless steel region, bonding region and core regions notably omitting any observable distinction (e.g., interface) between the respective regions.

The determination of the thickness and composition of the stainless steel region, bonding region, and optionally the core region is determined by cross-sectional analysis of a sample of the herein described products. Preferably, the sample is defined by a 1 cm by 1 cm region of the face of the product. The sample is then cut through the center of the 1 cm by 1 cm region and the face exposed by the cut is polished on a Buehler EcoMet 250 ginder-polisher. A five step polishing process includes 5 minutes at a force of 6 lbs. with a Buehler 180 Grit disk, 4 minutes at a force of 6 lbs. with a Hercules S disk and a 6 μm polishing suspension, 3 minutes at a force of 6 lbs. with a Trident 3/6 μm disk and a 6 μm polishing suspension, 2 minutes at a force of 6 lbs. with a Trident 3/6 μm disk and a 3 μm polishing suspension, and then 1.5 minutes at a force of 6 lbs. with a microcloth disk and a 0.05 μm polishing suspension. The cut and polished face is then in an instrument capable of energy-dispersive X-ray spectroscopy (EDX). The above provided grinding-polishing procedure may cross-contaminate distinct layers, as expected the contamination can be consistent across the polished face. Therefore, a baseline measurement of a region that is free of a first element may display a greater than baseline concentration of the first element by EDX (see, for example, FIG. 4). The increase in the base line is dependent on the area of the regions polished and the concentration of the respective elements in the polished faces.

What is claimed is:

1. A steel sheet comprising:
   a first stainless steel region having a thickness of about 5 μm to about 250 μm;
   a first bonding region positioned between the first stainless steel region and a core region, the first bonding region having a thickness that is greater than 1 μm and less than the thickness of the first stainless steel region;
   the core region having a thickness of about 100 μm to about 4 mm, the core region having a core composition that comprises at least 85 wt. % iron;
   a second bonding region positioned between the core region and a second stainless steel region;
   the second stainless steel region having a thickness of about 5 μm to about 250 μm;
   the second bonding region having a thickness that is greater than 1 μm and less than the thickness of the second stainless steel region;
   the first and second stainless steel regions having stainless steel compositions that, individually, comprise an admixture of iron and chromium, and a chromium concentration of about 10 wt. % to about 30 wt. % that varies by less than 5 wt. %; and
   the first and second bonding regions having bonding compositions, the bonding composition, individually, comprising an admixture of iron and chromium, having a chromium concentration proximal to the respective stainless steel region that is approximately equal to the chromium concentration of the stainless steel region and having a chromium concentration proximal to the core region that has less than about 2 wt. % chromium.

2. The steel sheet of claim 1, wherein the first and second stainless steel composition, individually, comprises an admixture of iron, chromium, and nickel, and comprises a nickel concentration of about 5 wt. % to about 20 wt. % that varies by less than 5 wt. %; and wherein the respective first and second bonding compositions further comprise nickel.

3. The steel sheet of claim 1, wherein the first and second stainless steel composition, individually, comprises an admixture of iron, chromium, and a transition metal selected from the group consisting of nickel, molybdenum, titanium, niobium, tantalum, vanadium, tungsten, copper, and a mixture thereof.

4. The steel sheet of claim 1 further comprising a steel sheet thickness of about 0.1 mm to about 4 mm.

5. The steel sheet of claim 1, wherein the first stainless steel region has a thickness of about 10 μm to about 100 μm, the first bonding region has a thickness of about 5 μm to about 100 μm, the second bonding region has a thickness about 5 μm to about 100 μm, and the second stainless steel region has a thickness of about 10 μm to about 100 μm.

6. The steel sheet of claim 1, wherein the core composition comprises an iron concentration that is greater than 98 wt. %.

7. The steel sheet of claim 6, wherein the core composition comprises an iron concentration that is greater than 99 wt. %.

8. The steel sheet of claim 1, wherein the first stainless steel composition comprises an admixture of iron, chromium, and nickel; wherein the first stainless steel composition comprises a nickel concentration of about 5 wt. % to about 20 wt. %.

9. The steel sheet of claim 8, wherein the first stainless steel composition comprises a chromium concentration of about 16 wt. % to about 25 wt. % and nickel concentration of about 6 wt. % to about 14 wt. %.

10. The steel sheet of claim 8, wherein the first stainless steel composition consists essentially of iron, chromium and nickel.

11. The steel sheet of claim 8, wherein the first stainless steel composition further comprises manganese.

12. The steel sheet of claim 8, wherein the first bonding composition consists essentially of iron, chromium and nickel.

13. The steel sheet of claim 8, wherein the second stainless steel composition comprises an admixture of iron, chromium, and nickel; wherein the second stainless steel composition comprises a nickel concentration of about 5 wt. % to about 20 wt. %.

14. The steel sheet of claim 13, wherein the first and second stainless steel compositions, individually, consist essentially of iron, chromium and nickel, wherein the first and second bonding compositions, individually, consist essentially of iron, chromium and nickel.

15. The steel sheet of claim 1, wherein the first stainless steel composition comprises a chromium concentration of about 10.5 wt. % to about 18 wt. %.

16. The steel sheet of claim 13, wherein the first stainless steel composition consists essentially of iron and chromium; and wherein the first bonding composition consists essentially of iron and chromium.

17. The steel sheet of claim 13, wherein the second stainless steel composition comprises a chromium concentration of about 10.5 wt. % to about 18 wt. %.

18. The steel sheet of claim 17, wherein the first and second stainless steel compositions, individually, consist essentially of iron and chromium; and wherein the first and second bonding compositions, individually, consist essentially of iron and chromium.

19. The steel sheet of claim 1, wherein the steel sheet includes less than 5% plastic deformation.

20. The steel sheet of claim 1, wherein the stainless steel regions, individually, comprise a stainless steel layer of a stainless steel alloy that has a consistent composition and does not include a concentration gradient.

21. A steel form having a stainless steel exterior, the steel form comprising:
    a core region, a bonding region and a stainless steel region;
    the core region metallurgically bonded to the stainless steel region by the bonding region; the core region comprising at least 55 wt. % iron;
    the stainless steel region having a thickness of about 5 μm to about 250 μm, having a stainless steel composition, and including the stainless steel exterior, the stainless steel composition comprising an admixture of iron and chromium, and the stainless steel composition comprising a chromium concentration of about 10 wt. % to about 30 wt. % that varies by less than 5 wt. %; and
    the bonding region positioned between the stainless steel region and the core region, the bonding region having a thickness that is greater than 5 μm and less than the thickness of the stainless steel region, and having a bonding composition, the bonding composition comprising an admixture of iron and chromium, and the bonding composition having a chromium concentration proximal to the stainless steel region that is approximately equal to the chromium concentration of the stainless steel region and having a chromium concentration proximal to the core region that has less than about 5 wt. % chromium.

22. The steel form of claim 21, wherein the core region is substantially free of chromium.

23. The steel form of claim 21, wherein the core region is a carbon steel having a carbon concentration of less than about 0.5 wt. %.

24. The steel form of claim 23, wherein the core region is a carbon steel having a carbon concentration of less than about 0.25 wt. %.

25. The steel form of claim 21, wherein the stainless steel region has a thickness of about 10 µm to about 100 µm.

26. The steel form of claim 21, wherein the bonding region has a thickness of about 5 µm to about 100 µm.

27. The steel form of claim 26, wherein the bonding region has a thickness of about 10 µm to about 50 µm.

28. The steel form of claim 21, wherein the stainless steel composition comprises an admixture of iron, chromium, and a transition metal selected from the group consisting of nickel, molybdenum, titanium, niobium, tantalum, vanadium, tungsten, copper, and a mixture thereof.

29. The steel form of claim 21, wherein the stainless steel composition comprises an admixture of iron, chromium, and nickel; wherein the stainless steel composition comprises a nickel concentration of about 5 wt. % to about 20 wt. %; and wherein the bonding composition consists essentially of iron, chromium and nickel.

30. The steel form of claim 29, wherein the stainless steel composition comprises a chromium concentration of about 16 wt. % to about 25 wt. % and nickel concentration of about 6 wt. % to about 14 wt. %.

31. The steel form of claim 29, wherein the stainless steel composition consists essentially of iron, chromium and nickel.

32. The steel form of claim 21, wherein the stainless steel composition comprises a chromium concentration of about 10.5 wt. % to about 18 wt. %.

33. The steel form of claim 32, wherein the stainless steel composition consists essentially of iron and chromium; and wherein the bonding composition consists essentially of iron and chromium.

34. A steel form comprising:

a brushed stainless steel surface carried by a stainless steel region;

the stainless steel region having a thickness of about 5 µm to about 200 µm, having stainless steel composition that includes an admixture of iron and chromium, and a chromium concentration of about 10 wt. % to about 30 wt. % that varies by less than 5 wt. %, the stainless steel region carried by a bonding region;

the bonding region having a thickness of about 5 µm to about 200 µm but less than the thickness of the stainless steel region, the bonding region metallurgically bonding the stainless steel region to a core region;

the core region having a core composition that includes at least 85 wt. % iron;

the bonding region further comprising a bonding composition that includes an admixture of iron and chromium, and a bonding region concentration gradient that decreases from a chromium concentration proximal to the stainless steel region that is approximately equal to the chromium concentration of the stainless steel region to a chromium concentration proximal to the core region that is less than about 1 wt. %.

* * * * *